US007265629B2

(12) United States Patent
Manku (10) Patent No.: US 7,265,629 B2
(45) Date of Patent: Sep. 4, 2007

(54) CIRCUIT AND METHOD FOR AUTOMATIC GAIN CONTROL

(75) Inventor: Tajinder Manku, Waterloo (CA)

(73) Assignee: Sirific Wireless Corporation, Waterloo, Ontario (CA)

( * ) Notice: Subject to any disclaimer, the term of this patent is extended or adjusted under 35 U.S.C. 154(b) by 168 days.

(21) Appl. No.: 11/092,566

(22) Filed: Mar. 29, 2005

(65) Prior Publication Data

US 2006/0220742 A1    Oct. 5, 2006

(51) Int. Cl.
*H03F 3/04* (2006.01)
(52) U.S. Cl. .................................................. 330/289
(58) Field of Classification Search ............. 330/129, 330/131, 254, 278; 455/127.3; 375/345
See application file for complete search history.

(56) References Cited

U.S. PATENT DOCUMENTS

| 4,879,505 | A | 11/1989 | Barrow et al. |
| 4,975,598 | A | 12/1990 | Borkar |
| 5,479,096 | A | 12/1995 | Szczyrbak et al. |
| 5,796,650 | A | 8/1998 | Wik et al. |
| 5,901,323 | A | 5/1999 | Milliken et al. |
| 5,903,012 | A | 5/1999 | Boerstler |
| 5,949,228 | A | 9/1999 | Shoaei et al. |
| 5,982,312 | A | 11/1999 | Okamoto |
| 6,194,968 | B1 | 2/2001 | Winslow |
| 6,304,121 | B1 | 10/2001 | Wang |
| 6,480,061 | B2 * | 11/2002 | Dolman et al. ................ 330/2 |
| 6,515,917 | B2 | 2/2003 | Lamb et al. |
| 6,625,433 | B1 * | 9/2003 | Poirier et al. ............. 455/232.1 |
| 6,639,425 | B2 | 10/2003 | Yazdy |
| 6,714,036 | B2 | 3/2004 | Figueras et al. |
| 6,970,794 | B2 * | 11/2005 | Sutardja ...................... 702/65 |
| 2004/0162697 | A1 | 8/2004 | Smith et al. |

FOREIGN PATENT DOCUMENTS

| CA | 2104922 | 4/1994 |
| JP | 04236517 | 8/1992 |
| JP | 08181610 | 7/1994 |

* cited by examiner

*Primary Examiner*—Robert Pascal
*Assistant Examiner*—Hieu Nguyen
(74) *Attorney, Agent, or Firm*—Shin Hung; Borden Ladner Gervais LLP (57) ABSTRACT

A system for generating a supply voltage, temperature and process compensated gain control voltage from a digital data word. In particular, the compensated gain voltage control voltage maintains a linear relationship between a change in gain in response to an input gain control voltage for a gain circuit of a transmitter circuit. A monitor circuit senses at least one of the supply voltage, temperature and process parameters, and generates a first set of digital signals corresponding to the sensed parameter. A digital compensator circuit converts the input gain control voltage into a second set of digital signals, and decodes the combined first and second set of digital signals to provide a data word. The data word is converted into an analog voltage representing the compensated gain voltage control voltage. The digital compensator circuit includes a table of compensation values, each accessible by a distinct combination of the first and second set of digital signals.

19 Claims, 9 Drawing Sheets

CIRCUIT AND METHOD FOR AUTOMATIC GAIN CONTROL

FIELD OF THE INVENTION

The present invention relates generally to wireless communication systems. More particularly, the present invention relates to automatic gain control in wireless communication systems.

BACKGROUND OF THE INVENTION

Figure 1:
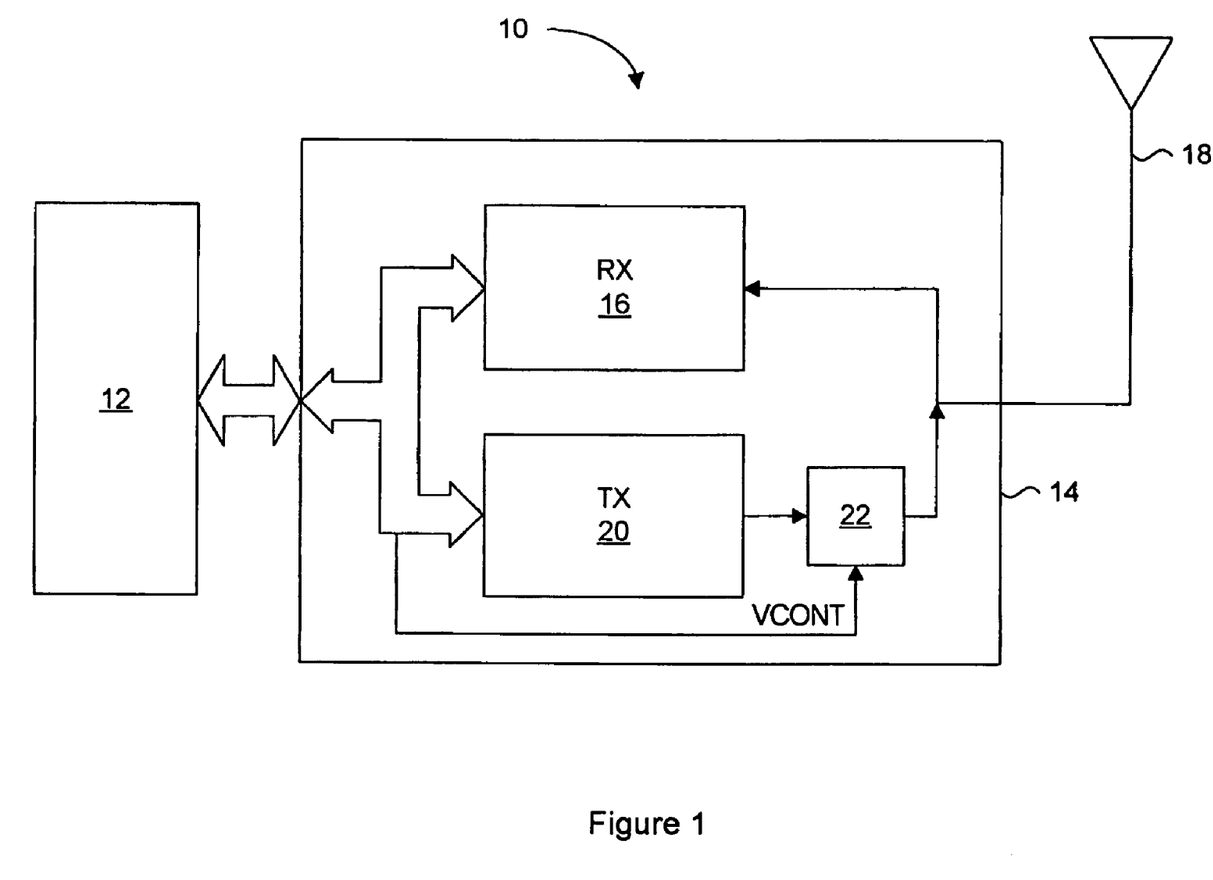
FIG. 1 is a block diagram of the core of a wireless device.

Wireless devices have been in use for many years for enabling mobile communication of voice and data. Such devices can include mobile phones and wireless enabled personal digital assistants (PDA's) for example. FIG. 1 is a generic block diagram of the core components of such wireless devices. The wireless core 10 includes a baseband processor 12 for controlling application specific functions of the wireless device and for providing and receiving voice or data signals to a radio frequency (RF) transceiver chip 14. The RF transceiver chip 14 is responsible for frequency up-conversion of transmission signals, and frequency down-conversion of received signals. RF transceiver chip 14 includes a receiver core 16 connected to an antenna 18 for receiving transmitted signals from a base station or another mobile device, and a transmitter core 20 for transmitting signals through the antenna 18 via a gain circuit 22. Those of skill in the art should understand that FIG. 1 is a simplified block diagram, and can include other functional blocks that may be necessary to enable proper operation or functionality.

An important function of wireless core 10 is to control transmission signal gain in response to base station requests. Typically, the base station in communication with the wireless device will instruct the wireless device to increase the gain for transmission, since the previously transmitted signals may have been detected as being sub-optimal. Those of skill in the art will understand that the request from the base station is embedded within the communication signal being transmitted to the wireless device. This increase can be specified as being a 10 dB increase, for example. Alternately, the base station can instruct the wireless device to reduce gain, in order to conserve battery power of the wireless device while maintaining optimal performance. To adjust the gain provided by gain circuit 22, baseband processor 12 will generate an analog input control voltage signal VCONT for controlling gain circuit 22 to provide the desired gain.

In fact, the relationship between the desired gain and the voltage level of VCONT should be linear, and many standards presently in use specify a close to linear relationship between VCONT and gain. Such standards include EDGE and WCDMA communications standards for example, and failure to adhere to this particular aspect of such standards can result in non-certification of the wireless core for sale or use in standard-compliant wireless devices.

Most radio frequency (RF) devices, which typically include gain circuits, are manufactured using SiGe, GaAs, or other heterojunction technologies. Those of skill in the art will understand the advantages provided by SiGe and GaAs devices. GaAs devices have higher electron mobility, run on low power, and generate less noise than traditional CMOS devices, while SiGe heterojunction devices have good forward gain and low reverse gain characteristics, which translate into low current and high frequency performance than typically available from homojunction or traditional bipolar transistors. Gain circuits fabricated with such technologies generally exhibit a substantially linear relationship between gain and VCONT. However, such manufacturing technologies are relatively new, very complex, and hence expensive. Consequently, the costs for manufacturing these RF devices can be prohibitive. Complementary Metal Oxide Semiconductor (CMOS) technology on the other hand, is a very mature and inexpensive fabrication process for the production of semiconductor devices.

Figure 2:
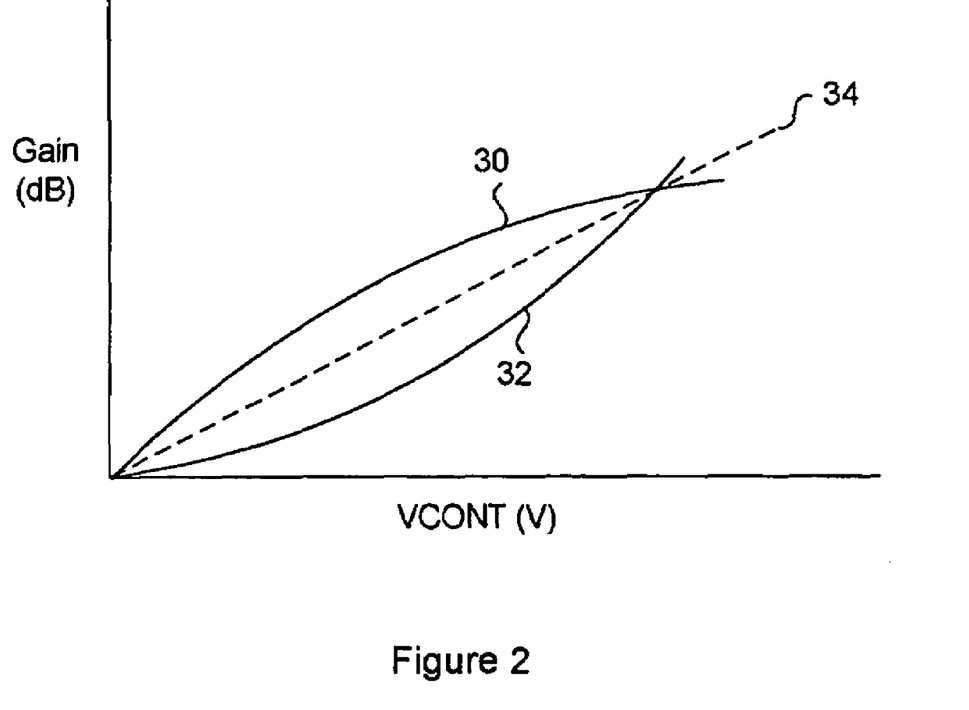
FIG. 2 is a plot of gain in dB versus an input control voltage VCONT.

Unfortunately, CMOS gain circuits do not exhibit a substantially linear characteristic between gain and the input control voltage VCONT. A plot of VCONT (in volts V) versus gain (in dB) is shown in FIG. 2 to illustrate the non-linear characteristics of a standard gain circuit manufactured with CMOS technology. As shown in FIG. 2, the actual gain per VCONT increment is not consistent across the VCONT range, and the gain will change in a non-linear fashion with respect to a change in VCONT, as shown by curves 30 and 32. By example, a desired linear relationship between VCONT and gain is shown by curve 34.

Further compounding this non-linearity are variants, such as supply voltage variations, operating temperature variations, and process variations. These variations can cause a shift in the curves shown in FIG. 2, and/or exacerbate the existing non-linear response of the circuit. Those of skill in the art will appreciate that any one of these variants can affect the operating characteristics of transistor devices, and ultimately, the gain characteristics of the circuit. Supply voltage variations refers to a change in the power supply, operating temperature variations refers to the temperature experienced by the circuit due to environment, and process variation refers manufacturing anomalies that result in the transistor threshold voltages other than that which was designed for.

This non-linearity due to the inherent properties of CMOS and the previously described variants can be corrected, or compensated, within the gain circuit through feedback mechanisms or use of reference circuits.

Figure 3:
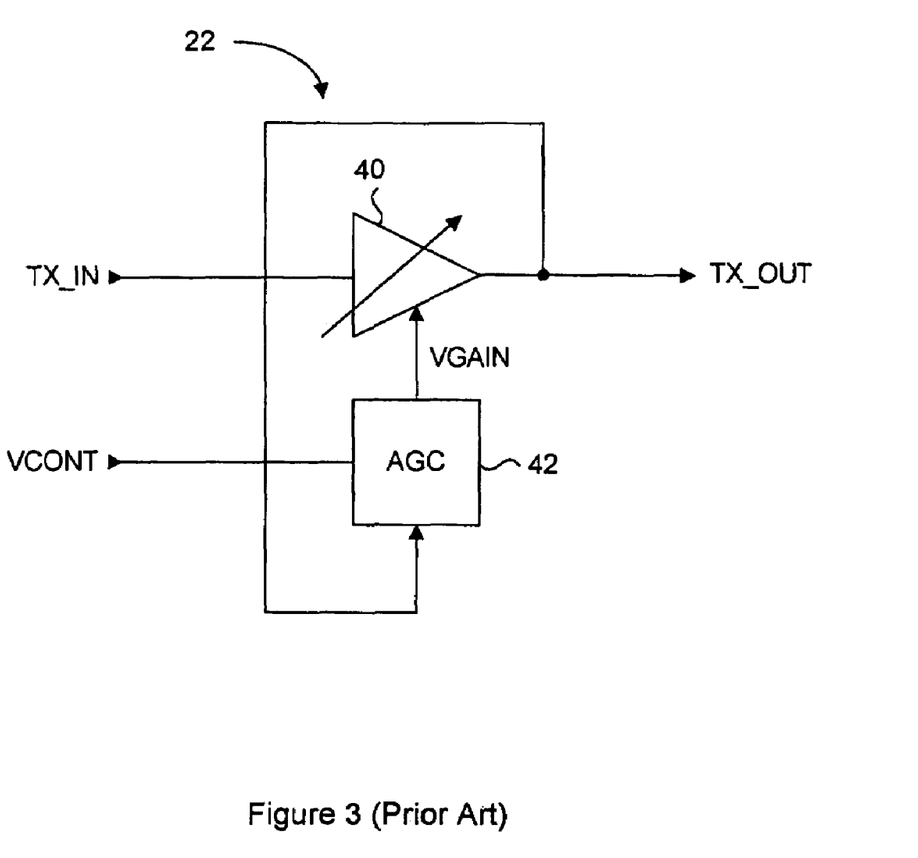
FIG. 3 is a block diagram of a prior art automatic gain control circuit with feedback compensation.

FIG. 3 is a block diagram of gain circuit 22 shown in FIG. 1, with a feedback mechanism for non-linearity compensation. Gain circuit 22 includes a variable amplifier circuit 40 for receiving a transmit input signal TX_IN generated by transmitter core 20, and for generating transmit output signal TX_OUT. The gain of TX_OUT is determined by the signal VGAIN. An automatic gain circuit (AGC) 42 generates VGAIN in response to input control voltage VCONT and the fed-back TX_OUT signal. In principle, AGC 42 compares the fed-back level of TX_OUT to VCONT, and appropriately adjusts VGAIN to ensure that the desired gain of TX_OUT is obtained. Unfortunately, this technique for automatic adjustment of the gain is not suitable due to loading of the TX_OUT node by the feed back loop line to AGC 42. This loading can cause distortion and loss of output signal strength, and is hence, undesirable. This loading may also introduce noise in the TX signal which is also undesirable.

Figure 4:
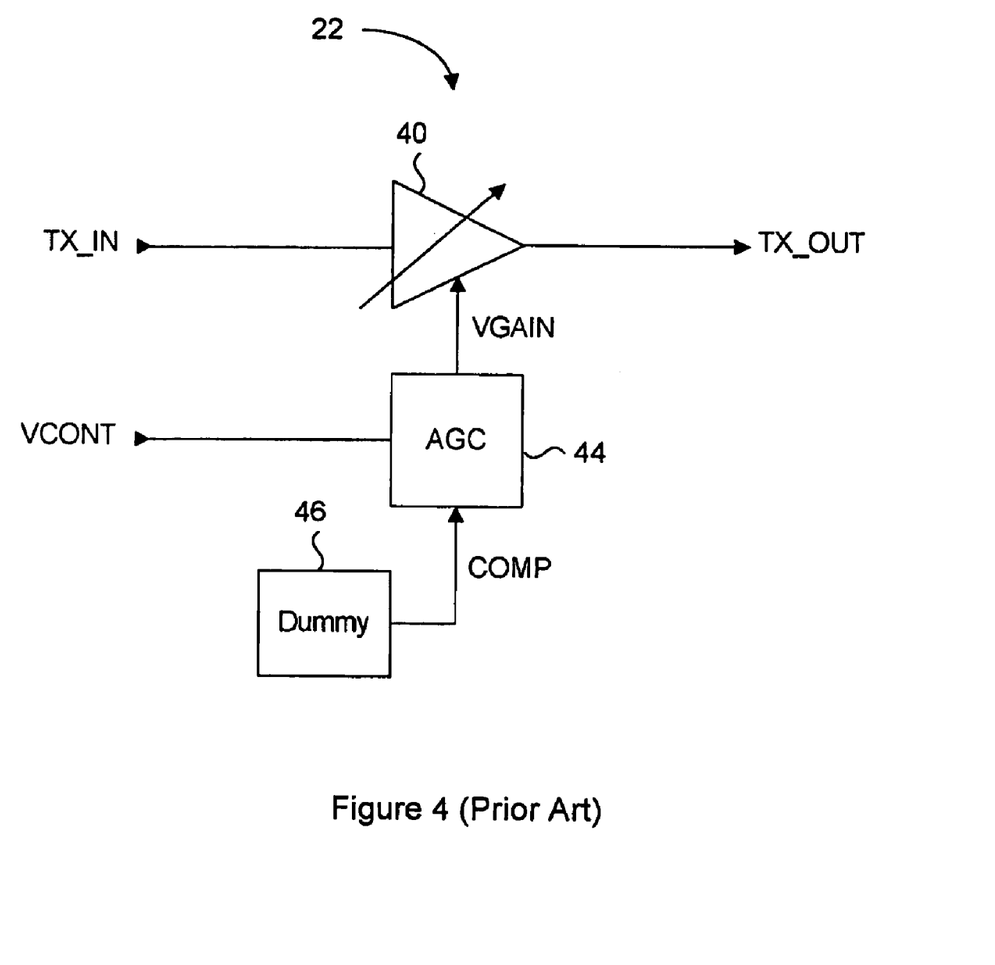
FIG. 4 is a block diagram of a prior art automatic gain control circuit with reference circuit compensation.

FIG. 4 is a block diagram of gain circuit 22 shown in FIG. 1, with a reference replica circuit, also known as a dummy circuit, for non-linearity compensation. Gain circuit 22 includes a variable amplifier circuit 40 for receiving a transmit input signal TX_IN generated by transmitter core 20, and for generating transmit output signal TX_OUT. As with the circuit of FIG. 3, the gain of TX_OUT is determined by signal VGAIN. An AGC 44 generates VGAIN in response to input control voltage VCONT and compensation signal COMP. Signal COMP is generated by replica circuit 46, which is used by AGC 44 to adjust VGAIN. The replica circuit 46 can include identically configured elements of variable amplifier circuit 40, which functions as a reference circuit used to track electrical variations of the variable amplifier circuit 40. However, this technique is not effective for adjusting VGAIN properly in response to supply voltage, process and temperature variations. More specifically, the range of adjustment is limited by virtue of the fact that the replica circuit may not be capable of detecting supply voltage, temperature and process variations due to the analog nature of the dummy circuit, which lacks reproducibility and controllability.

It is, therefore, desirable to provide an automatic gain control circuit that can accurately and effectively maintain a substantially linear relationship between gain and the input control voltage while compensating for supply voltage, temperature and process variations, in CMOS fabricated gain circuits.

SUMMARY OF THE INVENTION

It is an object of the present invention to obviate or mitigate at least one disadvantage of previous automatic gain circuits. More specifically, it is an object of the present invention to provide a system for generating a temperature, supply voltage and process compensated gain control voltage in response to a control voltage provided by a wireless device baseband processor.

In a first aspect, the present invention provides a voltage generating circuit for providing an output voltage corresponding to an input voltage and at least one measurable parameter. The voltage generating circuit includes a monitor circuit and a digital compensator circuit. The monitor circuit senses the at least one measurable parameter and converts said at least one measurable parameter into an offset address. The digital compensator circuit receives the input voltage and the offset address, and converts the input voltage into a base address. The digital compensator circuit provides a data word addressable by a combination of the base address and the offset address, and includes a D/A converter for converting the data word into the output voltage.

In an embodiment of the present aspect, the monitor circuit includes a detector circuit and an analog-to-digital converter. The detector circuit senses an electrical value corresponding to the at least one measurable parameter. The analog-to-digital converter receives the electrical value and converts said electrical value into the offset address. The monitor circuit can include latching means for storing the offset address.

According to another embodiment of the present aspect, the monitor circuit can include a process parameter sensing circuit for measuring a threshold voltage of a minimum-sized transistor, a voltage supply parameter sensing circuit for measuring a supply voltage coupled to the voltage generating circuit and a temperature parameter sensing circuit for providing a voltage corresponding to a temperature. The monitor circuit can further include a process A/D converter for receiving the measured threshold voltage and converting said measured threshold voltage into a first portion of the offset address, a voltage supply A/D converter for receiving the measured supply voltage and converting said measured supply voltage into a second portion of the offset address, and a temperature analog-to-digital converter for receiving the voltage and converting said voltage into a third portion of the offset address. The monitor circuit can include latching means for storing the first, second and third portions of the offset address.

In yet another embodiment of the present aspect, the monitor circuit can include a process parameter sensing circuit, a voltage supply parameter sensing circuit, a temperature parameter sensing circuit, an analog multiplexor, and an A/D converter. The process parameter sensing circuit measures a threshold voltage of a minimum-sized transistor. The voltage supply parameter sensing circuit measures a supply voltage coupled to the voltage generating circuit. The temperature parameter sensing circuit provides a voltage corresponding to a temperature. The analog multiplexor selectively passes one of the threshold voltage, the supply voltage, and the voltage. The A/D converter converts the one of the threshold voltage, the supply voltage, and the voltage into the offset address. The monitor circuit can include a latch for storing the offset address.

In a further embodiment of the present aspect, the digital compensator circuit can include an A/D converter for converting the input voltage into the base address. The digital compensator circuit can include a memory circuit for decoding the combination of the base address and the offset address to provide the data word, and the memory circuit can include an address decoder for receiving the base address and the offset address, for generating a decoded address for accessing a storage location in the memory circuit corresponding to the preset data word.

In a second aspect, the present invention provides an automatic gain control circuit for generating a compensated voltage gain signal in response to a control voltage. The automatic gain control circuit can include a first parameter measuring circuit for providing a first voltage, a second parameter measuring circuit for providing a second voltage, a conversion circuit, latching means, an analog-to-digital converter, and a digital compensator circuit. The conversion circuit selectively receives the first and the second voltages, and converts the first voltage into a first portion of the offset address and the second voltage into a second portion of the offset address. The latching means latches the first portion of the offset address and the second portion of the offset address, and aggregates the first and the second offset addresses into an offset address. The analog-to-digital converter receives the control voltage and converts the control voltage into a base address. The digital compensator circuit receives the base address and the offset address. The digital compensator circuit generates the compensated voltage gain signal from a data word corresponding to a combination of the base address and the offset address.

According to an embodiment of the present aspect, the digital compensator circuit can include a memory circuit for decoding the combination of the base address and the offset address to provide the data word, and a D/A converter for receiving the data word and converting the data word into the compensated voltage gain signal. The memory circuit can include an address decoder for decoding the combination of the base address and the offset address into a decoded address, the decoded address accessing a storage location of the data word in the memory circuit.

In another embodiment of the present aspect, the conversion circuit can include an analog multiplexor for selectively passing the first voltage and the second voltage, and a parameter A/D converter for receiving the first voltage and the second voltage. The parameter A/D converter converts the first voltage into the first offset address portion and the second voltage into the second offset address portion.

In a third aspect, the present invention provides a method for generating a gain control voltage compensated by at least one measured analog parameter in response to an input voltage, the gain control voltage controlling gain in a variable amplifier. The method includes generating an offset address corresponding to the at least one measured analog parameter, generating a base address corresponding to the control voltage, decoding a combination of the base address and the offset address to access a preset data word stored in a memory, and converting the preset data word into the gain control voltage.

According to an embodiment of the present aspect, the step of generating an offset address includes sensing a voltage level corresponding to the at least one measured analog parameter, converting the voltage level corresponding to the at least one measured analog parameter into the offset address, and latching the offset address. The voltage level can correspond to a threshold voltage of a minimally sized transistor, a supply voltage of the variable amplifier or a temperature of the variable amplifier.

In yet another embodiment of the present aspect, the step of generating an offset address includes sensing a voltage level corresponding to one measured analog parameter, converting the voltage level into a portion of the offset address, storing the portion of the offset address, and repeating steps i to iii for a predetermined number of different analog parameters, such that the offset address corresponds to all the stored portions. The previously described steps can be repeated after a predetermined delay, or when the variable amplifier is inactive.

In other embodiments of the present aspect, the step of generating a base address can include converting the input voltage into the base address. The step of decoding can include decoding the combination of the base address and the offset address into a decoded memory address. The step of converting can include converting the preset data word into an analog voltage with a digital to analog converter, the gain control voltage being represented by the analog voltage.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a system for generating a supply voltage, temperature and process compensated gain control voltage from a digital data word. In particular, the compensated gain voltage control maintains a substantially linear relationship between gain and an input control voltage for a gain circuit of a transmitter circuit. A monitor circuit senses at least one of the supply voltage, temperature and process parameters, and generates a first set of digital signals corresponding to the sensed parameter. A digital compensator circuit converts the input control voltage into a second set of digital signals, and decodes the combined first and second set of digital signals to access a memory for providing a data word. The data word is converted into an analog voltage representing the compensated gain voltage control signal. The parameters can be periodically sensed to update the first set of address signals in the event that any of the parameters have changed since the previous parameter sensing operation.

By converting the sensed analog voltage signals of each parameter and the input gain control voltage into the digital domain, and executing compensation adjustment in the digital domain, customized control over the compensated gain voltage control signal can be obtained. In fact, wider and finer control of the value of the compensated gain voltage can be obtained when compared to all-analog solutions. This is due to the use of a memory device in the digital compensator circuit which can be programmed with the appropriate compensation data. The compensation data can be obtained through standard calibration testing, or through simulation modeling of the gain circuits. Of course, the resolution of the digital portion of the gain circuit of the present invention can be optimized for specific applications.

Figure 5:
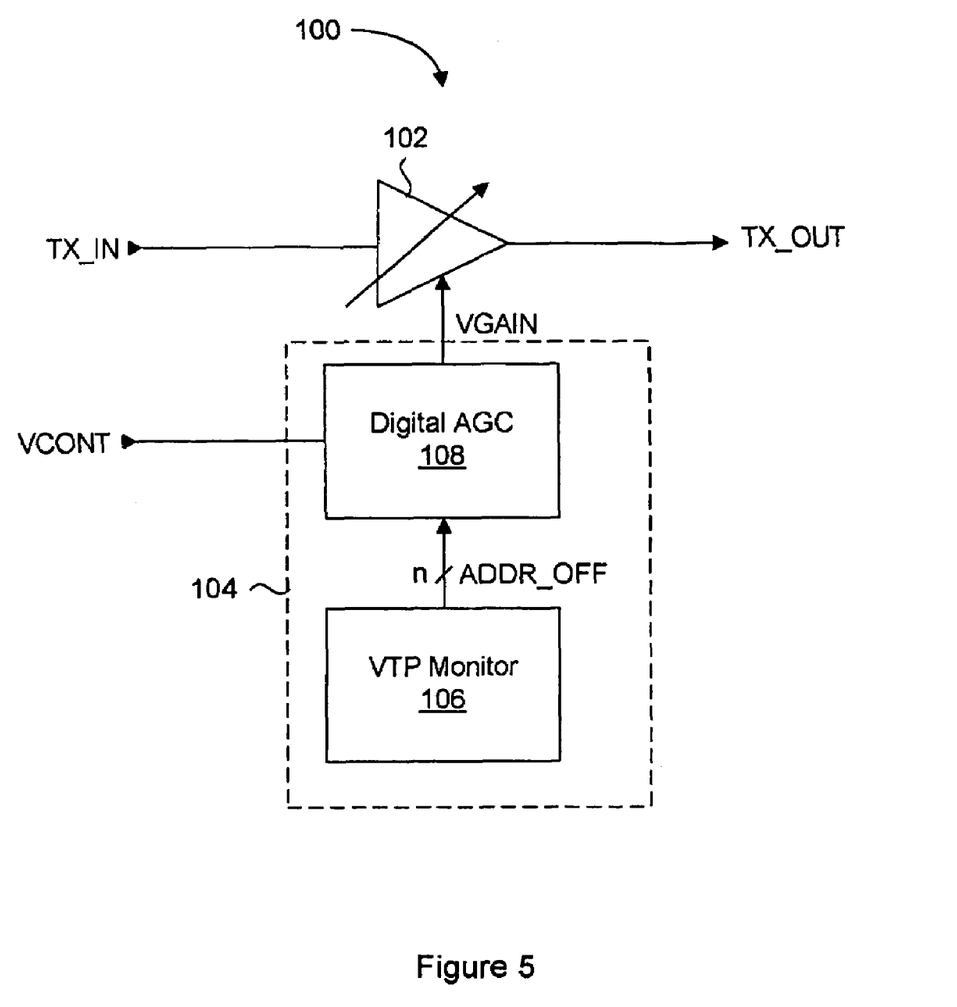
FIG. 5 is a block diagram of a gain control circuit with a VTP compensation circuit according to an embodiment of the present invention.

A voltage gain circuit for a transmitter of a wireless core according to an embodiment of the present invention is shown in FIG. 5. The circuit embodiment of gain circuit 100 shown in FIG. 5 can be used as gain circuit 22 shown in FIG. 1. Gain circuit 100 includes a variable amplifier 102, and a VTP compensation circuit 104. Since variable amplifier 102 can be identical to the variable amplifiers 40 of FIGS. 3 and 4, its functionality and operation will be the same as previously discussed for variable amplifiers 40. VTP compensation circuit 104 is responsible for sensing at least one parameter of the device, and appropriately adjusting the compensated gain voltage control signal VGAIN, in response to the input control voltage VCONT and the sensed at least one parameter.

VTP compensation circuit 104 includes two major functional blocks. First is a VTP monitor 106 and the second is a digital compensator 108. The VTP monitor circuit 106 includes standard well-known circuits for sensing any one or more of a supply voltage parameter, a temperature parameter, and a process parameter. Of course, any other measurable parameter can be sensed with a corresponding dedicated circuit. VTP monitor circuit 106 then generates a set of digital signals, ADDR_OFF, that corresponds to the set of analog voltages in the digital domain provided by the dedicated sensing circuits. In the present example, this set of digital signals represents an offset address of n-bits, where n can be any integer value greater than 0. As will be discussed later, the number of bits of the address will be determined in part by the resolution of the system. This offset address is provided to digital compensator 108, which also receives input control voltage VCONT. As previously discussed, VCONT is an analog input control voltage provided by the base-band processor for adjusting the gain of variable amplifier 100.

Digital compensator 108 converts VCONT into a set of digital signals m-bits wide called a base address ADDR_BASE, which is combined with the offset address ADDR_OFF provided by VTP monitor circuit 106. The combined address is then used to access a preset data word, the preset data word effectively representing a digital form of the compensated gain control voltage. VGAIN is generated by converting the digital preset word into an equivalent analog voltage level. Once again, the resolution of the system can be optimized for the application.

Figure 6:
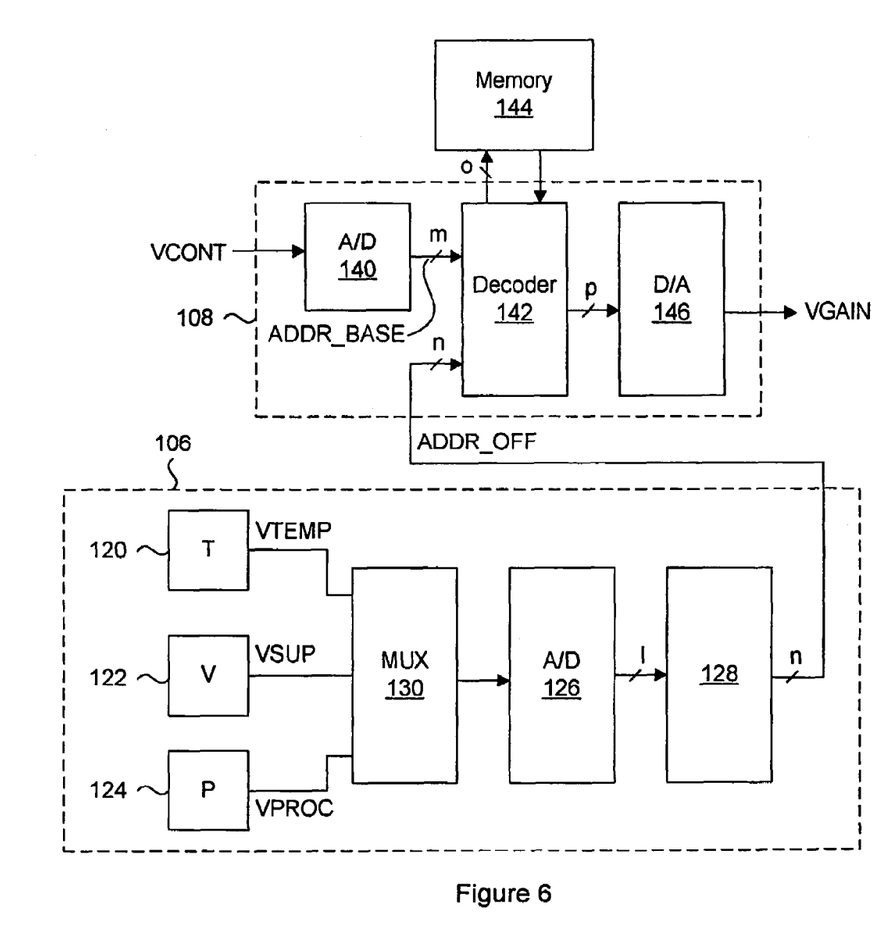
FIG. 6 is a block diagram showing the details of the VTP compensation circuit of FIG. 5, according to an embodiment of the present invention.

FIG. 6 is a block diagram showing further details of VTP monitor 106 and digital compensator 108. Details of VTP monitor 106 will now be discussed. According to the present example shown in FIG. 6, VTP monitor 106 includes parameter sensing circuits 120, 122 124, an analog-to-digital (A/D) converter 126, and registers 128. More specifically, the parameter sensing circuits can include a temperature sensing circuit 120, a supply voltage sensing circuit 122, and a process sensing circuit 124. According to a preferred embodiment of VTP monitor 106, an analog multiplexor 130 is included for selectively coupling the sensed voltage from one of the three parameter sensing circuits to A/D converter 126. The analog multiplexor 130 is not necessarily required if each parameter sensing circuit has its own dedicated A/D converter 126, however, in the interest of conserving silicon area, inclusion of the analog multiplexor 130 is preferred. In the presently described embodiment, the A/D converters preferably have a 4-bit resolution. Those of skill in the art will understand that higher or lower resolution converters can be used according to the specific application.

In general operation, the three parameter sensing circuits 120, 122 and 124 provide analog voltages VTEMP, VSUP, and VPROC respectively, to MUX 130. In response to a pair of selection signals (not shown), MUX 130 will selectively and sequentially pass each analog voltage to A/D converter 126. If for example AND converter 126 is a 4-bit converter, then the output of A/D converter 126 will generate a 4-bit set of digital signals (I=4). The registers 128 then latch this first set of digital signals, in accordance with the states of the pair of selection signals. In the presently described embodiment, circuit 128 would include at least 12 individual registers, for latching each 4-bit set of digital signals. Although not shown in FIG. 6, registers 128 includes a multiplexor for selectively passing each 4-bit set of digital signals to a corresponding set of registers associated with one digitized parameter. All the registers can be output enabled, to drive all the ADDR_OFF bits simultaneously after all the parameters have been sensed and latched. The selection signals (2-bit signal for 1 of 3 selection) for the de-multiplexor can be the same as those for MUX 130, as both circuits would operate synchronously.

Generally, MUX 130 and A/D converter 126 operate as a conversion circuit for generating portions of the offset address ADDR_OFF, which are eventually combined together to form the offset address ADDR_OFF. Once all three parameters have been sensed and provided in digital signal form to registers 128, 12 bit offset address ADDR_OFF (n=3 sets of signals×4 signals/set=12) is provided to digital compensator 108.

In the interest of conserving silicon area, it is preferable to limit the number of ADDR_OFF bus lines, especially in applications employing a higher resolution A/D converter 126. Therefore, according to another embodiment of VTP monitor 106 and digital compensator 108, registers 128 can include a number of registers equal to the resolution of A/D converter 126, and controlled such that each 4-bit set of address bits are driven serially. In the present application, with a 4-bit A/D converter 126, registers 128 would include 4 latching circuits, which drive a 4-bit ADDR_OFF signal. Since a full 12 bit offset address is required at decoder 142, decoder 142 would include a full set of registers and a corresponding multiplexor for passing each 4-bit ADDR_OFF signal to a corresponding set of registers. Once the entire offset address has been latched in decoder 142, digital compensator 108 is ready to receive VCONT. Alternately, registers 128 can be replaced with line drivers since decoder 142 would already include a full set of latch circuits.

Details of digital compensator 108 will now be discussed. Digital compensator 108 includes an A/D converter 140, a decoder 142, and a digital-to-analog (D/A) converter 146. The system can include memory 144, directly coupled to the decoder 142 for receiving memory access signals and for providing addressed memory contents in response to the memory access signals. Those familiar with semiconductor memory devices will understand that memory access signals can include block decoding signals, wordline access and column access signals. Of course, a practical implementation would have decoder 142 and memory 144 integrated together as a single unit. It is noted at this time that memory 144 is pre-loaded with data words, where each data word can be p-bits in width, and is a digital representation of a compensated gain voltage control signal for a specific VCONT voltage level and specific voltage levels of the sensed parameters. These data words can be determined through calibration and/or modeling, and written to memory during wireless device manufacture/assembly, or upon activation of the wireless device. In a practical implementation, memory 144 includes decoder 142, since the size and configuration of memory 144 is directly related to the number of received address bits. Accordingly, tighter VGAIN control can be obtained with a higher resolution system, which necessitates a larger memory 144 and a correspondingly larger number of address bits and higher resolution A/D and D/A converters.

In a preferred embodiment, memory 144 is a non-volatile memory such as Flash memory, one time programmable (OTP) memory or ROM for example, so that the memory contents are retained in the absence of power.

Alternately, other well known volatile memories, such as SRAM and DRAM can be used for storing the data words. In the event of power loss however, the system would include an appropriate circuit sub-system to enable writing of the volatile memory with the data words. The data words can be transmitted to the wireless device after power has been restored as part of a power up reset sequence, or the wireless device can be synchronized with a computer to restore the data words from installed files.

A/D converter 140 receives analog input control voltage VCONT, and converts it to a set of digital signals, representing base address ADDR_BASE. Accordingly, depending upon the resolution of A/D converter 140, ADDR_BASE can be m-bits wide. For example, A/D converter 140 can be a 4-bit converter. Decoder 142 receives and combines both ADDR_BASE and ADDR_OFF, to generate a decoded address, also known as memory access signals. Address decoding circuits for memory arrays are well known in the art. Those of skill in the art should understand that decoder 142 is configured to decode the bits of ADDR_BASE and ADDR_OFF such that one memory location of memory 144 is accessed. Accordingly, the mapping of the bits of ADDR_BASE and ADDR_OFF to the inputs of decoder 142 is preset.

Once memory 144 has received the memory access signals, the contents of a specific memory location, being a p-bit wide data word, are output to D/A converter 146 through decoder 142. D/A converter 146, preferably being a p-bit converter, will convert the p-bit input into analog voltage VGAIN.

Therefore, an appropriate VGAIN voltage level can be generated in response to any VCONT, and compensated for abnormal temperature, supply voltage or process variations, to maintain a linear relationship between the gain of the variable amplifier 102 and VCONT. Moreover, since each parameter sensing circuit is dedicated to sensing only one parameter, the parameters can be concurrently and independently sensed.

Figure 7:
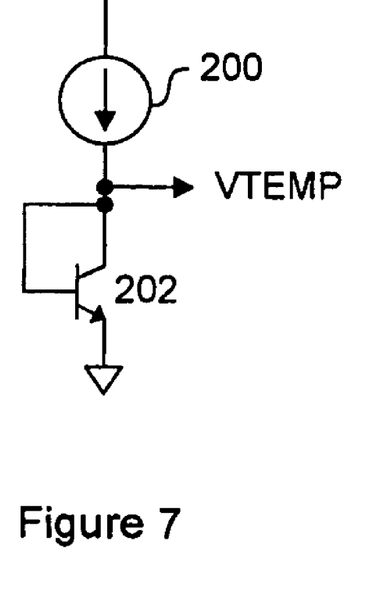
FIG. 7 is a circuit of a temperature monitoring circuit used in the VTP monitor circuit of FIG. 6.
Figure 8:
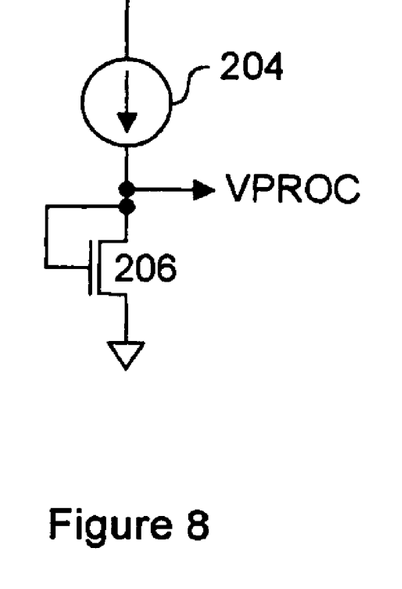
FIG. 8 is a circuit of a process monitoring circuit used in the VTP monitor circuit of FIG. 6.
Figure 9:
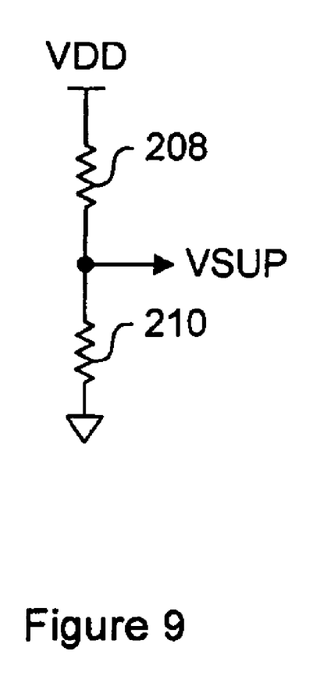
FIG. 9 is a circuit of a supply voltage monitoring circuit used in the VTP monitor circuit of FIG. 6; and, FIG. 10a-10b is a flow chart outlining a method for automatic gain control according to an embodiment of the present invention.

FIGS. 7-9 show circuit examples of parameter sensing circuits that can be used in VTP monitor 106 of FIG. 6.

FIG. 7 is a circuit of temperature sensing circuit 120, which includes a temperature independent current source 200 connected in series between a voltage supply VDD, bipolar transistor 202, and VSS. The base terminal of bipolar transistor is connected to its collector terminal and current source 200, while its emitter terminal is connected to VSS. Since bipolar transistor 202 inherently has a voltage-temperature dependence, the voltage level of VTEMP will vary at about 2 mV/degree C.

FIG. 8 is a circuit for process sensing circuit 124, which includes a temperature, process and supply voltage independent current source 204 connected in series between a voltage supply VDD, n-channel transistor 206, and VSS. Transistor 206 is diode-connected, and its source is connected to VSS. To measure process variations, this circuit senses the threshold voltage of transistor 206, which has minimally sized W/L dimensions. Since threshold voltage is set during the chip manufacturing process, it only needs to be sensed once, during a power up reset sequence for example.

FIG. 9 is a circuit of supply voltage sensing circuit 122, which includes resistors 208 and 210 connected in series between supply voltage VDD and VSS. The output VSUP is taken from the common node of resistors 208 and 210. Resistors 208 and 210 are preferably the same type of resistor, and have the same value. In the present embodiment, resistor 208 has a resistance value of R1 ohms, while resistor 210 has a resistance value of R2 ohms. Both resistors 208 and 210 can be formed on a semiconductor chip as doped polysilicon lines or diffusion regions, and preferably have the same layout and value so that temperature or processing differences can be tracked.

Those of skill in the art will understand that there are many different types of dedicated circuits that can be employed for sensing a parameter, and those shown in FIGS. 7-9 merely represent examples of such dedicated circuits. The range of temperature, supply voltage, and threshold voltage variance compensation can be set to the extremes where the wireless device would no longer function, or to predetermined ranges based on the particular application. For example, for portable wireless devices, it is unlikely that the wireless device would be used in a 100 degree Celsius environment by a user, hence the upper limit can be reduced to a more practical level. Therefore, the resolution of the system can be reduced in order to lower power consumption and/or silicon area consumption by using smaller circuits.

Figure 10A:
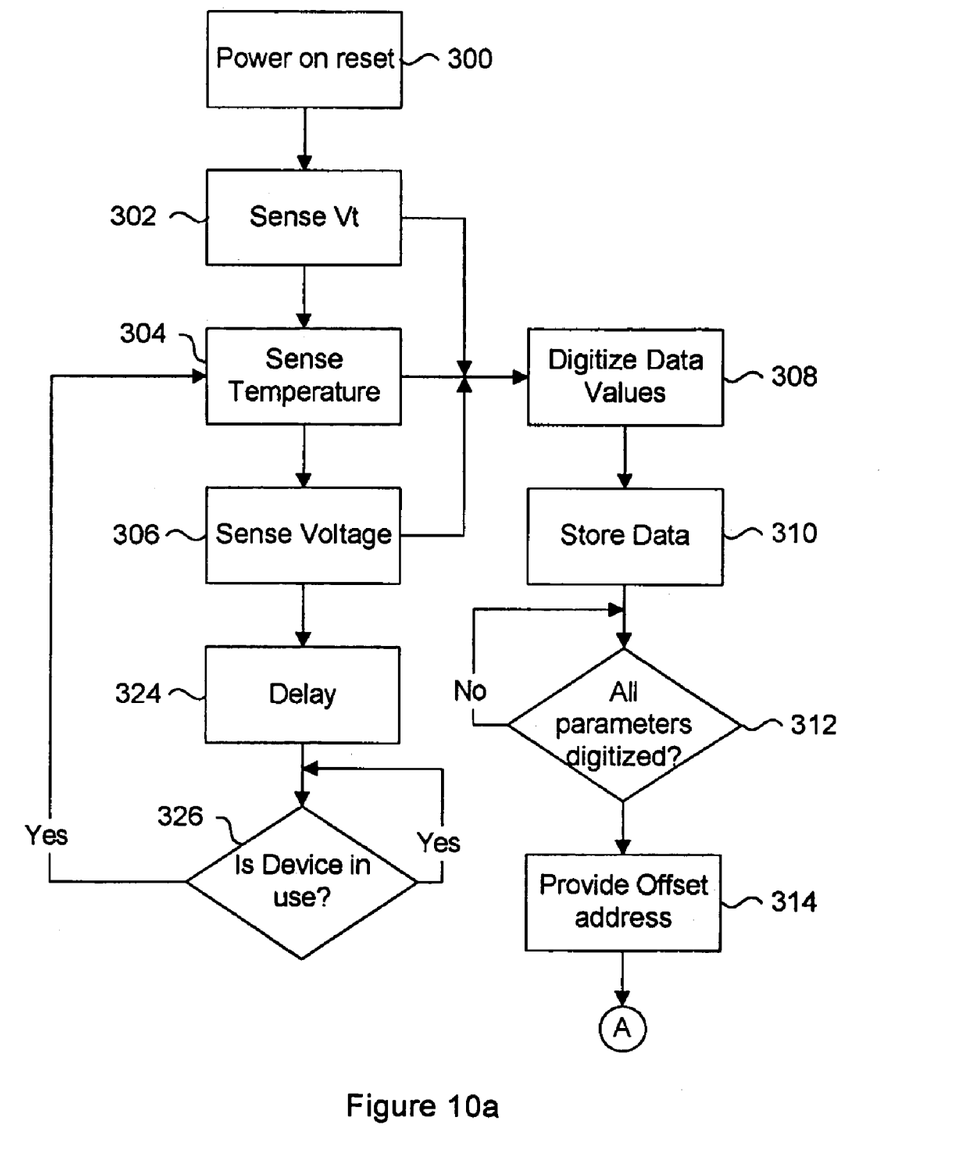
Figure 10B:
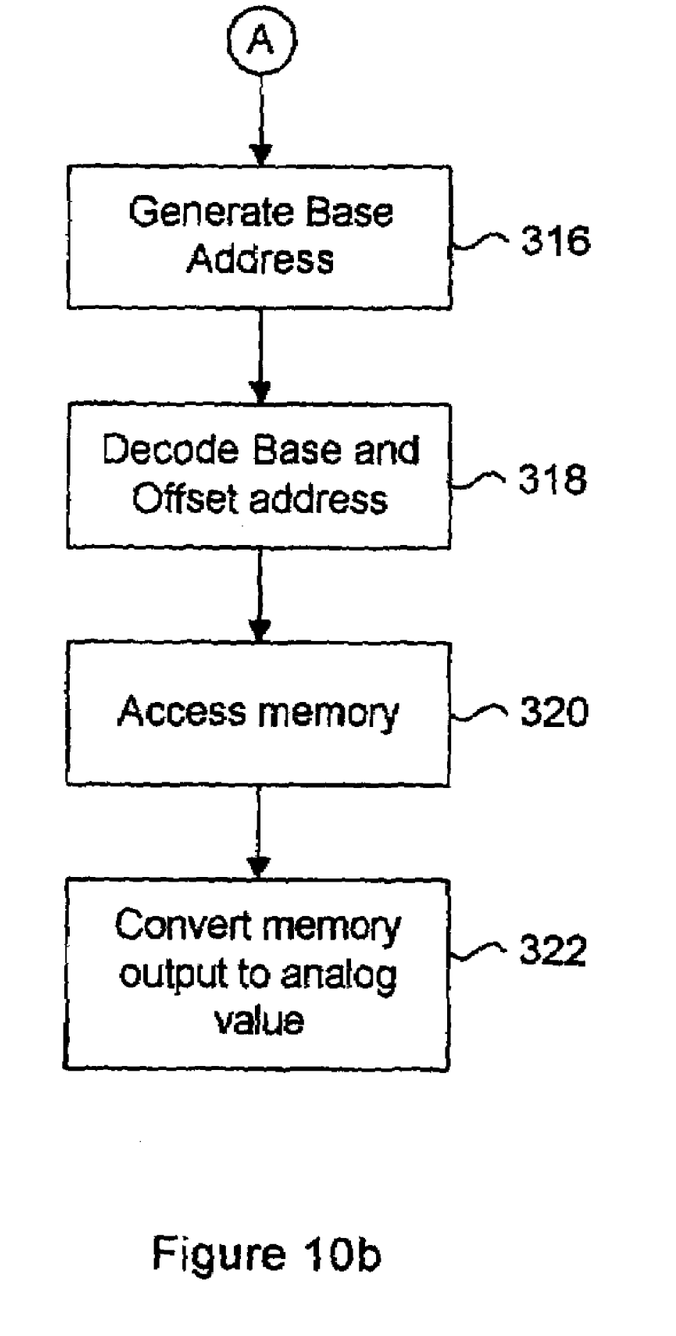

FIGS. 10a-10b illustrate a method for generating a compensated gain control voltage in response to sensed parameters and an input control voltage. It is assumed that the wireless device includes gain circuit 100 as previously described, and the memory 144 has been loaded with preset data words. The method starts at step 300 when the wireless device is powered up. Immediately following power up, the threshold voltage, temperature and supply voltage parameters are sensed in steps 302, 304 and 306 respectively. Each sensed parameter voltage is converted to a set of digital signals at step 308, and subsequently latched in step 310.

At step 312, if all the parameters have been sensed and stored, all the digital signals are driven and provided as the offset address ADDR_OFF at step 314. Otherwise, the method continues to check until all the parameters have been sensed and stored. Step 312 is preferred for the embodiment of the VTP monitor 106 shown in FIG. 6, where a MUX 130 is used to share a single A/D converter 126. Alternatively, step 312 is not required if VTP monitor 106 includes dedicated A/D converters 126 for each parameter sensing circuit. At step 314, the gain circuit is ready to receive input control voltage VCONT and provide an appropriate compensated VGAIN output.

Turning to FIG. 10b, analog input control voltage VCONT is received at step 316 and a base address ADDR_BASE is generated. As previously discussed, VCONT is provided by baseband processor 12 in response to a base station request to adjust gain. The combined base address and offset address is decoded at step 318 to generate a decoded address, or memory access signals, which are provided to memory 144. The location specified by the decoded address in memory 144 is accessed, and a corresponding preset data word is provided at step 320. The preset data word is received by D/A converter 146 and a corresponding analog voltage VGAIN is generated at step 322. VGAIN is subsequently provided to variable amplifier 102, and a corresponding adjustment of transmission gain is made.

Returning to FIG. 10a, a delay period is executed at step. 324 after the supply voltage is sensed at step 306. This delay can be set to any desired length of time, which determines the frequency at which the parameters are sensed, which consequently determines the frequency at which the offset address ADDR_OFF is updated. After the delay, a determination is made at step 326 to see if the transmitter core 20 is presently in use. This determination step is preferred to avoid the potential conflicts where VCONT is received while the offset address changes due to a new round of parameter sensing. If not, then the method returns to step 304 to begin sensing the temperature and voltage at steps 304 and 306. Otherwise, the method continues to check the status of transmitter core 20. Alternately, the method can loop back to delay step 324. It should be noted that the method does not need to loop back to step 302, to re-check the threshold voltage, from step 306, since the threshold voltage is set during fabrication of the chip.

Therefore, the presently described embodiment of the invention can linearly control the relationship between an input control voltage, such as VCONT, and desired gain from a variable amplifier circuit, by compensating for a specific manufacturing process, and dynamically variable and fixed parameters. In otherwords, the VTP compensation circuit will maintain the linear curve 34 of FIG. 2 for temperature, supply voltage, and process variations, for a specific manufacturing technology.

The previously described circuit blocks of the embodiments of the present invention include well known circuits, such as A/D and D/A converters, and are hence not shown in further detail as there are many different circuit implementations that can be used.

In alternate embodiments, input voltage signal VCONT can be provided to MUX 130, as a fourth input that can be selectively passed to A/D converter 126. Since registers 128 will latch the sensed parameter values, MUX 130 can pass VCONT by default such that A/D converter 126 can immediately convert VCONT and pass the base address ADDR_BASE to decoder 142. Thus, silicon area can be conserved since A/D converter 140 is not required.

As previously discussed, each parameter sensing circuit can have its own dedicated A/D converter for parallel conversion of the sensed voltage levels into digital signals. In this alternate embodiment, each A/D converter can have a different resolution. For example, the temperature sensing circuit 120 can be coupled to a 4-bit A/D converter for finer control of VGAIN in response to temperature, while supply voltage sensing circuit 122 and process sensing circuit 124 can be coupled to 2-bit A/D converters if coarser control is sufficient.

While the presently described embodiments of the invention utilize a memory, those of skill in the art will understand that the memory can be any type of non-volatile memory, such as EPROM, Flash, ROM, OTP for example. While volatile memories such as DRAM and SRAM can be used, those of skill in the art will understand that additional logic and data write circuits for interfacing with the baseband processor may be required to enable writing of data to the memory in the event of data loss due to battery power failure.

Although the parameters are measured by transistor circuit elements, other parameters can be sensed and measured from micro-electro-mechanical devices (MEMs) fabricated on a semiconductor chip with equal efficacy. Accordingly, the presently described embodiments of the invention can be applied to applications other than gain control for wireless devices. The present invention can be used in any application where customized control over an analog voltage is required in view of dynamically changing parameters.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A voltage generating circuit for providing an output voltage corresponding to an input voltage and at least one measurable parameter, comprising:
   a monitor circuit for sensing the at least one measurable parameter and for converting said at least one measurable parameter into an offset address having a first portion, a second portion and a third portion while the voltage generating circuit is inactive, the monitor circuit including
   a process parameter sensing circuit for measuring a threshold voltage of a minimum-sized transistor,
   a process A/D converter for receiving the measured threshold voltage and converting said measured threshold voltage into the first portion of the offset address,
   a voltage supply parameter sensing circuit for measuring a supply voltage coupled to the voltage generating circuit,
   a voltage supply A/D converter for receiving the measured supply voltage and converting said measured supply voltage into the second portion of the offset address,
   a temperature parameter sensing circuit for providing a voltage corresponding to a temperature, and,
   a temperature analog-to-digital converter for receiving the voltage and converting said voltage into the third portion of the offset address; and,
   a digital compensator circuit for receiving the input voltage and the offset address, the digital compensator circuit converting the input voltage into a base address and providing a data word addressable by a combination of the base address and the offset address, the digital compensator circuit including a D/A converter for converting the data word into the output voltage.

2. The voltage circuit of claim 1, wherein the monitor circuit includes
   a detector circuit for sensing an electrical value corresponding to the at least one measurable parameter, and
   an analog-to-digital converter for receiving the electrical value and converting said electrical value into the offset address.

3. The voltage circuit of claim 2, wherein the monitor circuit includes latching means for storing the offset address.

4. The voltage circuit of claim 1, wherein the monitor circuit includes latching means for storing the first, second and third portions of the offset address.

5. The voltage circuit of claim 1, wherein the digital compensator circuit includes an A/D converter for converting the input voltage into the base address.

6. The voltage circuit of claim 5, wherein the digital compensator circuit includes
   a memory circuit for decoding the combination of the base address and the offset address to provide the data word.

7. The voltage circuit of claim 6, wherein the memory circuit includes an address decoder for receiving the base address and the offset address, for generating a decoded address for accessing a storage location in the memory circuit corresponding to the preset data word.

8. An automatic gain control circuit for generating a compensated voltage gain signal in response to a control voltage, comprising:
   a first parameter measuring circuit for providing a first voltage;
   a second parameter measuring circuit for providing a second voltage;
   an analog multiplexor for receiving the first voltage and the second voltage and for selectively passing the first voltage and the second voltage;
   a parameter A/D converter for receiving the first voltage and the second voltage, the parameter A/D converter converting the first voltage into a first offset address portion and the second voltage into a second offset address portion;
   latching means for latching the first offset address portion and the second offset address portion, the latching means aggregating the first and the second offset address portions into an offset address;
   an analog-to-digital converter for receiving the control voltage and converting said control voltage into a base address; and,
   a digital compensator circuit for receiving the base address and the offset address, the digital compensator circuit generating the compensated voltage gain signal from a data word corresponding to a combination of the base address and the offset address.

9. The circuit of claim 8, wherein the digital compensator circuit includes
a memory circuit for decoding the combination of the base address and the offset address to provide the data word, and
a D/A converter for receiving the data word and converting said data word into the compensated voltage gain signal.

10. The circuit of claim 9, wherein the memory circuit includes an address decoder for decoding the combination of the base address and the offset address into a decoded address, the decoded address accessing a storage location of the data word in the memory circuit.

11. A method for generating a gain control voltage compensated by at least one measured analog parameter in response to an input voltage, the gain control voltage controlling gain in a variable amplifier, the method comprising:
(a) generating an offset address corresponding to the at least one measured analog parameter after a predetermined delay when the variable amplifier is inactive, the step of generating including
  i) sensing a voltage level corresponding to the at least one measured analog parameter,
  ii) converting the voltage level into a portion of the offset address,
  iii) storing the portion of the offset address,
  iv) repeating steps a) to c) for a predetermined number of different analog parameters, the offset address corresponding to all the stored portions;
(b) generating a base address corresponding to the control voltage;
(c) decoding a combination of the base address and the offset address to access a preset data word stored in a memory; and,
(d) converting the preset data word into the gain control voltage.

12. The method of claim 11, wherein the voltage level corresponds to a threshold voltage of a minimally sized transistor.

13. The method of claim 11, wherein the voltage level corresponds to a supply voltage of the variable amplifier.

14. The method of claim 11, wherein the voltage level corresponds to a temperature of the variable amplifier.

15. The method of claim 11, wherein the step of generating a base address includes converting the input voltage into the base address.

16. The method of claim 11, wherein the step of decoding includes decoding the combination of the base address and the offset address into a decoded memory address.

17. The method of claim 11, wherein the step of converting includes converting the preset data word into an analog voltage with a digital to analog converter, the gain control voltage being represented by the analog voltage.

18. A voltage generating circuit for providing an output voltage corresponding to an input voltage and at least one measurable parameter, comprising:
a monitor circuit for sensing the at least one measurable parameter and for converting said at least one measurable parameter into an offset address while the voltage generating circuit is inactive, the monitor circuit including
a process parameter sensing circuit for measuring a threshold voltage of a minimum-sized transistor,
a voltage supply parameter sensing circuit for measuring a supply voltage coupled to the voltage generating circuit,
a temperature parameter sensing circuit for providing a voltage corresponding to a temperature,
an analog multiplexor for selectively passing one of the threshold voltage, the supply voltage, and the voltage, and,
an A/D converter for converting the one of the threshold voltage, the supply voltage, and the voltage into the offset address; and,
a digital compensator circuit for receiving the input voltage and the offset address, the digital compensator circuit converting the input voltage into a base address and providing a data word addressable by a combination of the base address and the offset address, the digital compensator circuit including a D/A converter for converting the data word into the output voltage.

19. The voltage circuit of claim 18, wherein the monitor circuit includes a latch for storing the offset address.

* * * * *